United States Patent [19]

Spence et al.

[11] Patent Number: 5,258,985
[45] Date of Patent: Nov. 2, 1993

[54] COMBINATIONAL DATA GENERATOR AND ANALYZER FOR BUILT-IN SELF TEST

[75] Inventors: Nicholas J. M. Spence, Mesa; Glen D. Caby, Tempe, both of Ariz.

[73] Assignee: Motorola, Inc., Schaumburg, Ill.

[21] Appl. No.: 790,844

[22] Filed: Nov. 12, 1991

[51] Int. Cl.$^5$ ............................................. H04B 17/00
[52] U.S. Cl. ................................... 371/22.4; 371/22.5
[58] Field of Search ..................... 371/22.4, 22.3, 22.5, 371/15.1, 22.6

[56] References Cited

U.S. PATENT DOCUMENTS

| | | | |
|---|---|---|---|
| 4,513,418 | 4/1985 | Bardell, Jr. et al. | 371/22.4 |
| 4,534,020 | 8/1985 | Paez et al. | 371/22.4 |
| 4,571,724 | 2/1986 | Belmondo et al. | 371/22.1 |
| 4,601,033 | 7/1986 | Whelan | 371/22.4 |
| 4,740,970 | 4/1988 | Burrows et al. | 371/22.5 |
| 4,764,926 | 8/1988 | Knight et al. | 371/22.5 |
| 4,847,839 | 7/1989 | Hudson, Jr. et al. | 371/22.4 |
| 4,982,403 | 1/1991 | Du Chene et al. | 371/22.4 |

Primary Examiner—Robert W. Beausoliel, Jr.
Assistant Examiner—Phung Chung
Attorney, Agent, or Firm—Robert D. Atkins

[57] ABSTRACT

A built-in self test (BIST) circuit verifies the operation of a circuit under test in an integrated circuit. The BIST generates a series of test vectors with linear feedback shift register (LFSR) and applies the test vectors to the circuit under test. The output signal from the circuit under test in response to the test vectors is routed back and accumulating in a predetermined manner in the LFSR for providing a test signature. Thus, the same components in the LFSR generating the test vector also perform the accumulation of the test signature. The accumulating test signature may be used as a subsequent test vector.

6 Claims, 2 Drawing Sheets

COMBINATIONAL DATA GENERATOR AND ANALYZER FOR BUILT-IN SELF TEST

BACKGROUND OF THE INVENTION

This invention relates in general to built-in self test circuits and, more particularly, to a combined data generator and data analyzer for built-in self test applications.

In many circuit designs, especially application specific integrated circuits (ASIC), it is desirable to include a built-in self test (BIST) feature in the architecture to allow efficient testing during manufacturing and later for in-service field checks. Some of the advantages of BIST circuit design include efficiency of testing in that the manufacturer need not incur the time and expense of building dedicated test fixtures to preform functional and operational checks of the circuit under test. The BIST circuits are located within the integrated circuit (IC) and therefore become activated by an external control signal to functionally test the circuit. Moreover, BIST circuits allow the circuit under test to be verified at normal operating speeds for the IC, say 50 MHz, whereas multipurpose commercial IC testers typically operate at 1 MHz.

A disadvantage of the BIST approach is the physical area of the IC which must be allocated for the BIST circuit elements, leaving less space for normal functional components. Thus, the advantages and features available with a BIST circuit on-chip must be balanced against the loss of physical area in the IC otherwise useable for normal functional features.

Hence, what is needed is an improved BIST circuit using a minimal amount of the available IC area.

SUMMARY OF THE INVENTION

Briefly stated, the present invention comprises a built-in self test (BIST) circuit for testing the operation of a circuit under test by generating a test vector and accumulating output signals from the circuit under test in response to the test vector. A linear feedback shift register (LFSR) includes a first input coupled for receiving the output signals from the circuit under test and an output for providing the test vector to the circuit under test.

In another aspect, the present invention is a method of performing built-in self test (BIST) circuit for a circuit under test comprising the steps of generating a test vector with linear feedback shift register (LFSR), applying the test vector to the circuit under test for providing an output signal in response thereto, and accumulating the output signal from the circuit under test in a predetermined manner in the LFSR for providing a test signature.

DETAILED DESCRIPTION OF THE DRAWING

DETAILED DESCRIPTION OF THE PRIOR ART

Figure 1:
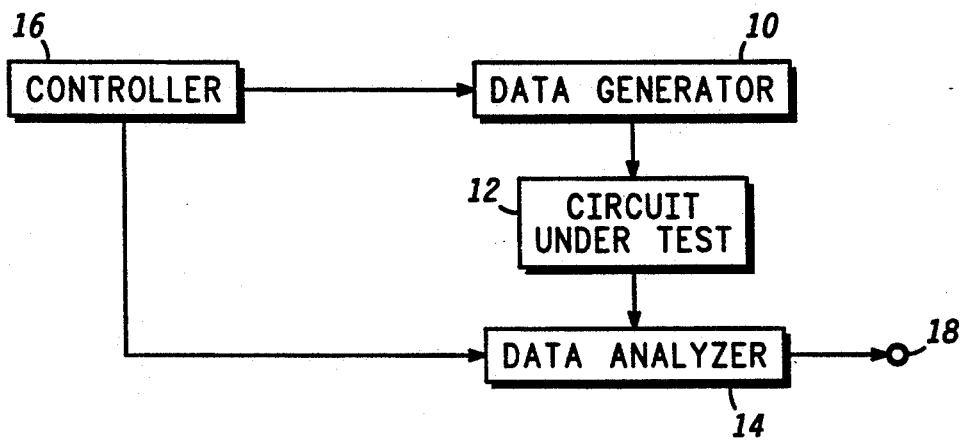
FIG. 1 is a block diagram illustrating a prior art BIST circuit.

A prior art BIST circuit is shown in FIG. 1 including data generator 10 for providing random test vectors to circuit under test 12 which operates on the test vectors and produces resultant output signals for application to data analyzer 14. The synchronization and control of data generator 10 and data analyzer 14 is performed by controller 16. A common implementation of data analyzer 14 utilizes a signature algorithm wherein the output signals from circuit under test 12 are accumulated in a predetermined manner and stored in an internal register of data analyzer 14. Once such accumulating register, known as a linear feedback shift register (LFSR), is widely recognized in the industry.

Given a common set of test vectors, any circuit under test 12 properly operating should produce the same output signals and the same resulting signature once the test patterns have been fed through circuit under test 12 and accumulated in data analyzer 14. At the conclusion of the accumulation process, the resulting signature is off-loaded via terminal 18 where it may be compared against a valid signature previously produced by a known good circuit. Those circuits under test not matching the valid signature are designated as faulty.

The aforedescribed prior art BIST circuit operates satisfactorily for those applications having excess area in the IC. However, most circuit designs are space sensitive and require efficient utilization of the available IC area in order to maximize area for functional components. Thus, although BIST circuits offer a number of advantages, one must also place importance toward minimizing the space requirements of the BIST features.

DETAILED DESCRIPTION OF THE PREFERRED EMBODIMENT

Figure 2:
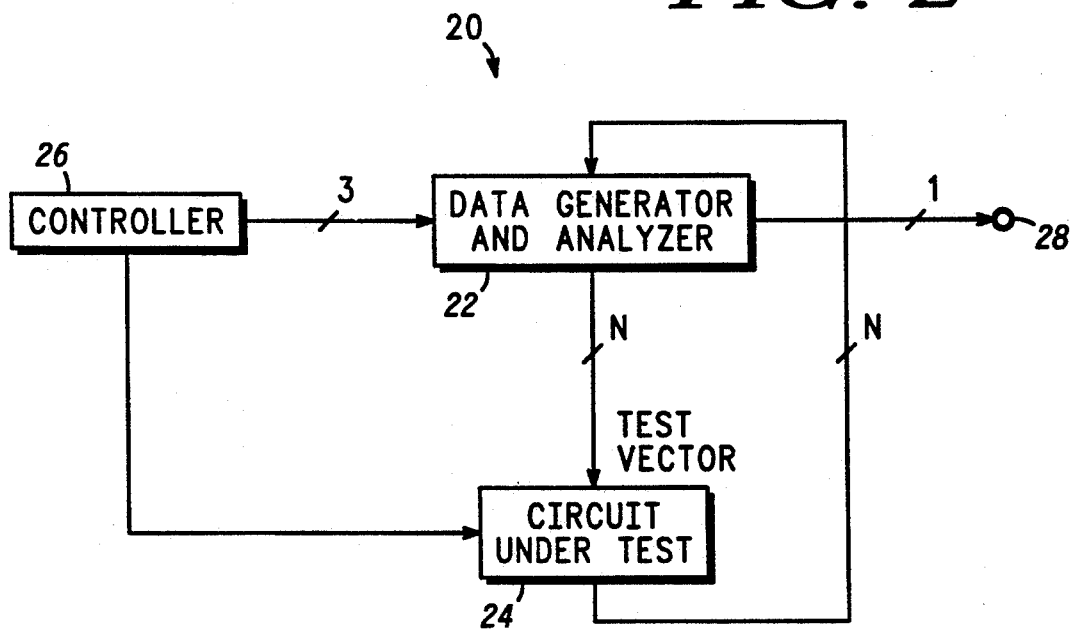
FIG. 2 is a block diagram illustrating a BIST circuit with combined data generator and data analyzer.

Referring to FIG. 2, BIST circuit 20 is shown as part of an integrated circuit including combined data generator/analyzer 22 having an output for providing an N-bit wide test vector to circuit under test 24. The N-bit wide output signal from circuit under test 24 is applied at the data input of data generator/analyzer 22 for accumulating the response from circuit under test 24 to the N-bit test vector. The accumulation process is typically performed by an LFSR and produces a signature of circuit under test 24 in response to the given set of test vectors at the completion of the test cycle.

Controller 26 provides control signals for synchronizing and controlling the operation of data generator/analyzer 22. During a test cycle, a predetermined number of test vectors are applied to circuit under test 24 and the responses are accumulated as a test signature in data generator/analyzer 22. For example, in a random access memory (RAM) type circuit under test, the test vectors are written to each addressable memory location and then read back into the LFSR. Upon completion of the test cycle, data generator/analyzer 22 serially shifts the resulting test signature through terminal 28 to comparison circuitry (not shown) for evaluation against a previously calculated valid signature from a known good circuit to determine whether circuit under test 24 is properly operating.

One key feature of the present invention is the combination of the data generator function and the data analyzer function into a circuit using common components. Thus, the physical area for the BIST feature is reduced by as much as one-half as compared to the prior art implementation shown in FIG. 1.

Figure 3:
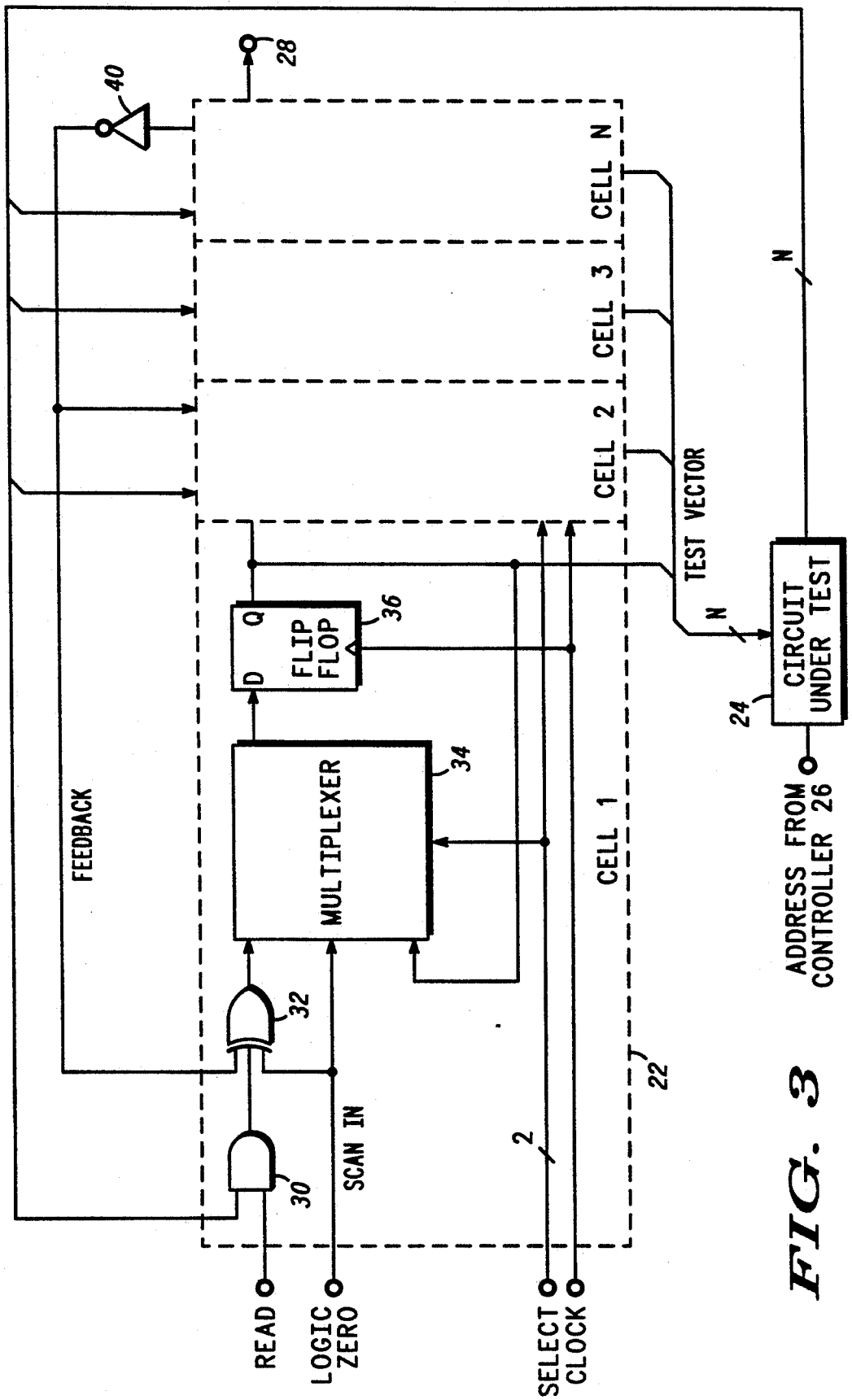
FIG. 3 is a schematic and block diagram illustrating further detail of the combined data generator and data analyzer.

Further detail of data generator/analyzer 22 is shown in FIG. 3 including four serially coupled cells labeled cell 1, cell 2, cell 3 and cell N configured as an LFSR.

A typical length of the LFSR is sixteen, although any reasonable number of cells could be included in the serial chain. Adding more cells in the chain increases the width of the test signature and improves the testing by providing more unique signatures for the given set of test vectors. A larger number of unique test signatures reduces the chance that a second fault in the circuit under test could negate a first fault and produce a valid signature.

Cell 1 is shown in detail with the understanding that cells 2-N follow the same construction. Cell 1 comprises AND gate 30 having a first input coupled for receiving a READ control signal. The output of AND gate 30 is coupled to the first input of exclusive-OR gate 32, the output of which is coupled to the first input of multiplexer 34. The second input of multiplexer 34 receives a SCAN IN signal. For cell 1 the SCAN IN signal is routed to ground potential for receiving a logic zero to allow initialization of the LFSR. The second input of exclusive-OR gate 32 also receives the SCAN IN signal. The output of multiplexer 34 is coupled to the D-input of flipflop 36. The clock input of flipflop 36 receives a CLOCK signal while the Q-output of flipflop 36 is coupled to a third input of multiplexer 34 and further provides one bit of an N-bit TEST VECTOR for application to circuit under test 24. A 2-bit SELECT signal controls multiplexer 34 selecting one of the three inputs thereof as the input signal to the D-input of flipflop 36. Multiplexer 34 may be implemented as two, 2-input multiplexers.

Although not specifically shown in FIG. 3, cell 2, cell 3 and cell N each include an AND gate 30, exclusive-OR gate 32, multiplexer 34 and flipflop 36. The READ control signal is applied at the first input of AND gates 30 of cells 1-N. The CLOCK signal is applied at the clock input of flipflops 36 and the SELECT control signal is applied at the control input of multiplexers 34 of cells 1-N. The SCAN IN signal of cell 2 comes from the Q-output of flipflop 36 of cell 1, and the SCAN IN signal of cell 3 comes from the Q-output of flipflop 36 of cell 2. Likewise, the SCAN IN signal of cell N comes from the Q-output of flipflop 36 of the preceding cell (cell 3). The Q-output of flipflops 36 of cells 2-N provide the remaining bits for the N-bit TEST VECTOR.

Circuit under test 24 operates on the TEST VECTOR in accordance with its designed function and produces an N-bit output signal. In the previous RAM example for circuit under test 24, the function is simply reading and writing data. The respective bits of the output signal from circuit under test 24 are applied at a second input of AND gates 30 in each of cells 1-N.

The LFSR approach in cells 1-N uses a feedback technique to maximize the number of available states and consequently the number of unique resultant test signatures in response to a set of test vectors. A number of feedback techniques are well documented in the literature by formula and table lookup for achieving the maximum number of unique test signatures for a given length of the LFSR. For the present simplified example, the output signal of flipflop 36 in cell N is coupled through inverter 40 to the third input of exclusive-OR gates 32 in cell 1 and cell 2. The second inputs of exclusive-OR gates 32 of cell 3 and cell N receive a fixed logic zero.

A sample operation of data generator/analyzer 22 proceeds as follows. Again assume circuit under test 24 is a RAM. The first phase of the test cycle involves writing random test vectors into locations of the RAM as determined by an ADDRESS control signal. Once the RAM is filled, BIST 20 reads the test vectors back during a second phase of the test cycle and formulates the test signature in the LFSR of cells 1-N.

The READ control signal, the SELECT control signal and the ADDRESS control signal are generated in controller 26 with combinational logic. For example, the ADDRESS signal may be generated by a counter circuit with the most significant bit thereof providing the READ control signal. The READ control signal begins as a logic zero to inhibit the output signals from circuit under test 24 by way of AND gates 30 of cells 1-N operating as digital switches. AND gate 30 is an optional component useful in RAM testing.

The SELECT control signal is set to route the logic zero applied at the second input of multiplexer 34 to the D-input of flipflop 36 of cell 1. After three more clock cycles, the logic zero ripples through cells 2-N creating a "0000" at the Q-outputs of flipflops 36 in cells 1-N. The "0000" TEST VECTOR is applied to circuit under test 24 and stored in the first address specified by the ADDRESS control signal, say location "0000".

The SELECT signal changes state to route the output signal of exclusive-OR gates 32 to the D-input of flipflops 36 of cells 1-N. In RAM write mode, exclusive-OR gates 32 receive the FEEDBACK signal (cells 1-2) and the SCAN IN signal (cells 1-N) from previous cell, e.g., the Q-output of flipflop 36 of cell 1 provides the SCAN IN signal for cell 2. A logic zero READ control signal blocks the output signal of circuit under test 24 from reaching exclusive-OR gates 32. The input signals of exclusive-OR gate 32 of cell 1 are thus a logic zero SCAN IN signal and a logic one FEEDBACK signal from the output of inverter 40, thereby producing a logic one output signal for the left-most bit of the TEST VECTOR signal. Likewise, the input signals of exclusive-OR gate 32 of cell 2 are a logic zero SCAN IN signal from the Q-output of flipflop 36 of cell 1 and a logic one FEEDBACK signal from the output of inverter 40, producing a logic one output signal. The output signals of exclusive-OR gates of cell 3 and cell N remain logic zero with logic zero input signals for both.

Following the next clock pulse, the second TEST VECTOR signal is "1100" at the Q-outputs of flipflops 36 of cells 1-N, respectively. The ADDRESS control signal is incremented and the "1100" TEST VECTOR is written into the second address location "0001" of the RAM. Simultaneously, exclusive-OR gates 32 of cells 1-N are calculating the third TEST VECTOR as "1010". The process continues incrementing addresses and generating test vectors until each location of RAM circuit under test 24 is occupied with a test vector.

During the second (read) phase of the test cycle, the READ control signal is set to logic one and the ADDRESS control signal starts again at "0000". A counter can easily generate control signals when testing a RAM by using the most significant bit as the READ control signal and the lesser bits as the ADDRESS control signal. Assume for simplicity that the final states of flipflops 36 in cells 1-N are again logic zeroes. Now the output signal from circuit under test 24 contributes to exclusive-OR gates 32 of cells 1-N. In cell 1, the first bit of the TEST VECTOR "0000" read from the first memory location combines with a logic one FEEDBACK signal from the output of inverter 40 and a logic zero SCAN IN signal. The Q-outputs of flipflops 36 of cells 1-N become "1100" after one clock cycle. The second read from RAM circuit under test 24 retrieves "1100", and the Q-outputs of flipflops 36 change to "0000" after another clock cycle. The third read from RAM circuit under test 24 is "1010", and the Q-outputs of 36 become "1110".

After reading the entire RAM circuit, the final value at the Q-outputs of flipflops 36 of cells 1-N is the test signature. Assuming that RAM circuit under test 24 is properly operating, the test signature is valid and repeatable. That is, other circuits under test like 24 will produce the same test signature given the aforedescribed sequence of test vectors. At the conclusion of a test cycle, the test signature is serially shifted out terminal 28 for comparison against the valid test signature. To disable BIST circuit 20, the SELECT control signal routes the output signal of flipflop 36 through multiplexer 34 back to its D-input. The TEST VECTOR thus remains "0000".

The testing process describes one example of a RAM circuit under test. In other embodiments, the testing cycle could be repeated several times (multiple read-/write cycles) before off-loading the final test signature. Alternately for circuits under test which perform some function or operation on the test vector, the READ control signal may remain at logic one allowing the result of the previous test vector from the circuit under test to figure into calculating the subsequent test vector.

Hence, what has been describe is a novel combined data generator and analyzer for performing BIST operations within ICs. By sharing the data generating and analyzing functions between common components, the BIST circuit uses less physical area and leaves more valuable space for normal functioning components. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A built-in self test (BIST) circuit for testing the operation of a circuit under test by generating a test vector and accumulating output signals from the circuit under test in response to the test vector, comprising:
a linear feedback shift register (LFSR) having a first input and an output, said first input being coupled for receiving the output signals from the circuit under test, said output providing the test vector to the circuit under test, said LFSR including a first cell comprising,
  (a) an exclusive-OR gate having first, second and third inputs and an output, said first input receiving a first one of said output signals from the circuit under test, said second input receiving a first scan-in signal, said third input receiving a first feedback signal from a second cell of said LFSR,
  (b) a multiplexer circuit having first, second and third inputs and further having a control input and an output, said first input being coupled to said output of said exclusive-OR gate, said second input receiving said first scan-in signal, said control input receiving a first control signal, and
  (c) a flipflop circuit having a data input, a clock input and an output, said data input being coupled to said output of said multiplexer circuit, said output being coupled to said output of said LFSR and to said third input of said multiplexer circuit, said output further providing a second scan-in signal to a third cell of the LFSR, said clock input receiving a clock signal.

2. The BIST circuit of claim 1 wherein said first cell of said LFSR further includes an AND gate having first and second inputs and an output, said first input receiving said first one of said output signals from the circuit under test, said second input receiving a second control signal, said output being coupled to said first input of said exclusive-OR gate.

3. The BIST circuit of claim 2 further including a control circuit for generating said first and second control signals.

4. In an integrated circuit, a built-in self test (BIST) circuit for testing the operation of a circuit under test by generating a test vector and accumulating output signals from the circuit under test in response to the test vector, comprising:
an accumulating register having a first input and an output, said first input being coupled for receiving the output signals from the circuit under test, said output providing the test vector to the circuit under test, said accumulating register including a first cell comprising,
  (a) an exclusive-OR gate having first, second and third inputs and an output, said first input receiving a first one of said output signals from the circuit under test, said second input receiving a first scan-in signal, said third input receiving a first feedback signal from a second cell of said accumulating register,
  (b) a multiplexer circuit having first, second and third inputs and further having a control input and an output, said first input being coupled to said output of said exclusive-OR gate, said second input receiving said first scan-in signal, said control input receiving a first control signal, and
  (c) a flipflop circuit having a data input, a clock input and an output, said data input being coupled to said output of said multiplexer circuit, said output being coupled to said output of said accumulating register and to said third input of said multiplexer circuit, said output further providing a second scan-in signal to a third cell of the accumulating register, said clock input receiving a clock signal.

5. The BIST circuit of claim 4 wherein said first cell of said accumulating register further includes an AND gate having first and second inputs and an output, said first input receiving said first one of said output signals from the circuit under test, said second input receiving a second control signal, said output being coupled to said first input of said exclusive-OR gate.

6. The BIST circuit of claim 5 further including a control circuit for generating said first and second control signals.

* * * * *